US011114170B2

(12) United States Patent
Handa et al.

(10) Patent No.: US 11,114,170 B2
(45) Date of Patent: *Sep. 7, 2021

(54) MEMORY SYSTEM

(71) Applicant: KIOXIA CORPORATION, Tokyo (JP)

(72) Inventors: Takaya Handa, Yokohama Kanagawa (JP); Yoshihisa Kojima, Kawasaki Kanagawa (JP); Kiyotaka Iwasaki, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/886,546

(22) Filed: May 28, 2020

(65) Prior Publication Data
US 2020/0294605 A1 Sep. 17, 2020

Related U.S. Application Data

(63) Continuation of application No. 16/115,516, filed on Aug. 28, 2018, now Pat. No. 10,706,940.

(30) Foreign Application Priority Data

Dec. 27, 2017 (JP) .............................. JP2017-251367

(51) Int. Cl.
G11C 16/26 (2006.01)
G11C 16/08 (2006.01)
(Continued)

(52) U.S. Cl.
CPC .............. *G11C 16/26* (2013.01); *G11C 7/106* (2013.01); *G11C 7/1063* (2013.01);
(Continued)

(58) Field of Classification Search
CPC ....... G11C 16/26; G11C 7/106; G11C 7/1063; G11C 7/1069; G11C 16/08; G11C 16/24;
(Continued)

(56) References Cited

U.S. PATENT DOCUMENTS 7,515,466 B2* 4/2009 Takada ................ G11C 11/5628
365/185.03
7,636,261 B2 12/2009 Shibata
(Continued)

*Primary Examiner* — Tri M Hoang
(74) *Attorney, Agent, or Firm* — Kim & Stewart LLP

(57) ABSTRACT

A semiconductor memory device includes a memory cell array, an input/output circuit configured to output read data from the semiconductor memory device, a first data latch configured to latch data read from the memory cell array as the read data, a second data latch to which the read data is transferred from the first data latch and from which the read data is transferred to the input/output circuit, a signaling circuit configured to output a ready signal or a busy signal, and a control circuit configured to control the signaling circuit to output the busy signal while the read data is being latched in the first data latch during a read operation performed on the memory cell array and to output the ready signal while the read data latched in the first data latch is being transferred from the first latch to the second latch.

20 Claims, 10 Drawing Sheets

(51) Int. Cl.
*G11C 16/32* (2006.01)
*G11C 16/24* (2006.01)
*G11C 7/10* (2006.01)
*G11C 7/22* (2006.01)

(52) U.S. Cl.
CPC ............ G11C 7/1069 (2013.01); G11C 16/08 (2013.01); G11C 16/24 (2013.01); G11C 16/32 (2013.01); *G11C 7/222* (2013.01)

(58) Field of Classification Search
CPC ..... G11C 16/32; G11C 7/222; G11C 16/0483; G11C 2211/5642; G11C 11/5671; G11C 11/5642
See application file for complete search history.

(56) References Cited

U.S. PATENT DOCUMENTS

| | | | | |
|---|---|---|---|---|
| 7,916,555 | B2* | 3/2011 | Nakamura | ............ G06F 3/0659 365/189.05 |
| 8,797,807 | B2* | 8/2014 | Yoshihara | ................ G11C 7/22 365/189.05 |
| 8,843,674 | B2* | 9/2014 | Shiga | ................ G11C 29/1201 710/36 |
| 2012/0210108 | A1* | 8/2012 | Ishizuka | ............... G11C 11/419 712/245 |
| 2013/0019053 | A1 | 1/2013 | Somanache et al. | |
| 2014/0226410 | A1 | 8/2014 | Nakamura et al. | |
| 2017/0018296 | A1* | 1/2017 | Jeong | ....................... G11C 8/06 |
| 2017/0110196 | A1 | 4/2017 | Jigour et al. | |

* cited by examiner

MEMORY SYSTEM

CROSS-REFERENCE TO RELATED APPLICATIONS

This application is a continuation of U.S. patent application Ser. No. 16/115,516, filed Aug. 28, 2018, now U.S. Pat. No. 10,706,940, issued Jul. 7, 2020, which is based upon and claims the benefit of priority from Japanese Patent Application No. 2017-251367, filed Dec. 27, 2017, the entire contents of which are incorporated herein by reference.

FIELD

Embodiments described herein relate generally to a memory system.

BACKGROUND

A NAND flash memory is known as a semiconductor memory.

DETAILED DESCRIPTION

Figure 1:
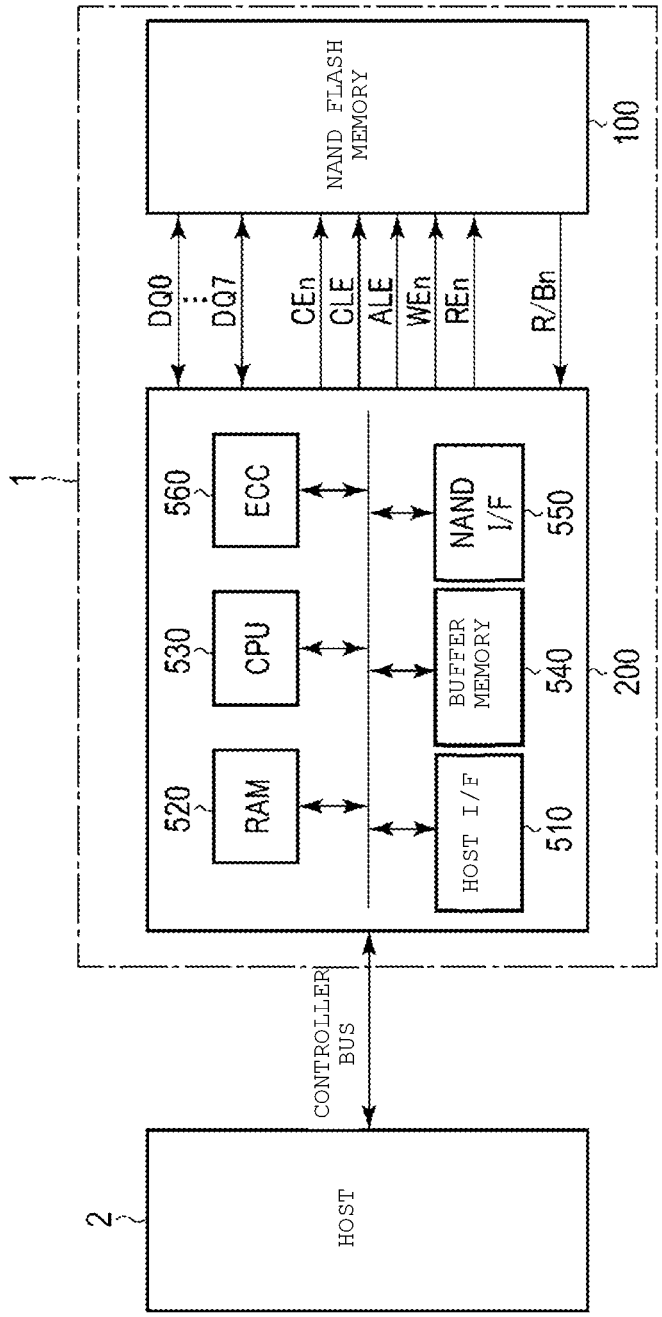
FIG. 1 is a block diagram illustrating a memory system according to a first embodiment.

Embodiments provide a semiconductor memory device capable of high speed data transmission.

In general, according to one embodiment, there is provided a semiconductor memory device including a memory cell array, an input/output circuit configured to output read data from the semiconductor memory device, a first data latch configured to latch data read from the memory cell array as the read data, a second data latch to which the read data is transferred from the first data latch and from which the read data is transferred to the input/output circuit, a signaling circuit configured to output a ready signal or a busy signal, and a control circuit configured to control the signaling circuit to output the busy signal while the read data is being latched in the first data latch during a read operation performed on the memory cell array and to output the ready signal while the read data latched in the first data latch is being transferred from the first latch to the second latch.

The memory system and the semiconductor memory according to the embodiment will be described with reference to FIGS. 1 to 12.

Hereinafter, the embodiments will be described in detail with reference to the drawings. In the following description, components having substantially the same functions and configurations are denoted by the same reference numerals.

In addition, in each of the following embodiments, in a case where it is unnecessary to distinguish the components (for example, word line WL, bit line BL, various voltages and signals, and the like) denoted by reference numerals accompanied by numerals/letters for distinction at the end, the numerals/letters (reference numerals) at the end will be omitted.

(1) First Embodiment

The memory system and the semiconductor memory according to the first embodiment will be described with reference to FIGS. 1 to 9.

(a) Configuration Example

A configuration example of the memory system and the semiconductor memory according to the first embodiment will be described with reference to FIGS. 1 to 5.

FIG. 1 is a block diagram illustrating the memory system according to the embodiment.

As illustrated in FIG. 1, a memory system 1 includes a semiconductor memory 100 and a controller 200.

For example, the semiconductor memory 100 is a NAND flash memory.

The NAND flash memory 100 stores data in a non-volatile manner. The NAND flash memory 100 is connected with the controller 200 via a NAND bus. The NAND flash memory 100 operates based on a command (instruction) from the controller 200.

The NAND flash memory 100 transmits or receives, for example, 8-bit signals DQ0 to DQ7 (hereinafter, in case where signals DQ0 to DQ7 are not distinguished, simply referred to as signal DQ or signal DQ[7:0]) to or from the controller 200. The signals DQ0 to DQ7 includes, for example, data, an address, and the command.

The NAND flash memory 100 receives, for example, a chip enable signal CEn, a command latch enable signal CLE, an address latch enable signal ALE, a write enable signal WEn, and a read enable signal REn from the controller 200. The NAND flash memory 100 transmits a ready/busy signal R/Bn to the controller 200.

The chip enable signal CEn is a signal for enabling the NAND flash memory 100. The chip enable signal CEn is asserted, for example, at a low ("L") level. The command latch enable signal CLE is a signal indicating that the signal DQ is the command. The command latch enable signal CLE is asserted, for example, at a high ("H") level. The address latch enable signal ALE is a signal indicating that the signal DQ is the address. The address latch enable signal ALE is asserted, for example, at the "H" level. The write enable signal WEn is a signal for accepting the received signal into the NAND flash memory 100. Whenever the command, the address, the data, and the like are received from the controller 200, the write enable signal WEn is asserted, for example, at the "L" level. Accordingly, whenever the write enable signal WEn is toggled, the signal DQ is accepted into the NAND flash memory 100. The read enable signal REn is a signal for the controller 200 reading the data from the NAND flash memory 100. The read enable signal REn is asserted, for example, at the "L" level. Accordingly, the NAND flash memory 100 outputs the signal DQ to the controller 200 based on the toggled read enable signal REn. The ready/busy signal R/Bn is a signal indicating whether the NAND flash memory 100 is at a busy state or a ready state (whether command from controller 200 is at an unreceivable state or a receivable state). For example, when the NAND flash memory 100 is at the busy state, a signal level of the ready/busy signal R/Bn is set to the "L" level.

The controller 200 instructs the NAND flash memory 100 to read, write, or erase the data in response to a request from a host device 2. The controller 200 manages a memory space of the NAND flash memory 100.

The controller 200 includes a host interface circuit 510, an internal memory (RAM) 520, a processor (CPU) 530, a buffer memory 540, a NAND interface circuit 550, an ECC circuit 560, and the like.

The host interface circuit 510 is connected with the host device 2 via a controller bus. The host interface circuit 510 manages communication with the host device 2. The host interface circuit 510 transmits the request and the data received from the host device 2 to the processor (CPU) 530 and the buffer memory 540. In addition, the host interface circuit 510 transmits the data in the buffer memory 540 to the host device 2 in response to an instruction of the processor 530.

The NAND interface circuit 550 is connected with the NAND flash memory 100 via the NAND bus. The NAND interface circuit 550 manages communication with the NAND flash memory 100. The NAND interface circuit 550 transmits the command received from the processor 530 to the NAND flash memory 100. At the time of writing, the NAND interface circuit 550 transmits write data in the buffer memory 540 to the NAND flash memory 100. At the time of reading, the NAND interface circuit 550 transmits the data read from the NAND flash memory 100 to the buffer memory 540.

The processor 530 controls the overall operation of the controller 200. The processor 530 issues various commands according to the command of the host device 2. The processor 530 transmits the command to the NAND flash memory 100. For example, when receiving a write request from the host device 2, the processor 530 transmits a write command to the NAND flash memory 100 in response to the received write command. In the same manner, when receiving a read request or an erase request, the processor 530 transmits the command to the NAND flash memory 100 in response to the request from the host device 2. The processor 530 executes various processes such as wear leveling for managing the NAND flash memory 100. The processor 530 executes various calculations. For example, the processor 530 executes an encryption process, a randomization process, and the like of the data.

The ECC circuit 560 executes an error checking and correcting process of the data.

The internal memory 520 is, for example, a semiconductor memory such as a DRAM. The internal memory 520 is used as an operation region of the processor 530. The internal memory 520 holds firmware, various management tables, and the like for managing the NAND flash memory 100.

The buffer memory 540 temporally holds data transmitted and received between the controller 200 and the NAND flash memory 100, data transmitted and received between the controller 200 and the host device 2, and data generated in the controller 200. The buffer memory 540 is, for example, an SRAM.

For example, a storage device may be configured with a combination of the controller 200 and the NAND flash memory 100. For example, the storage device is a memory card such as an SD™ card, a solid state drive (SSD), or the like.

The host device 2 requests the controller 200 to write, read, or erase the data to or from the NAND flash memory 100.

The memory system 1 may include the host device 2.

Figure 2:
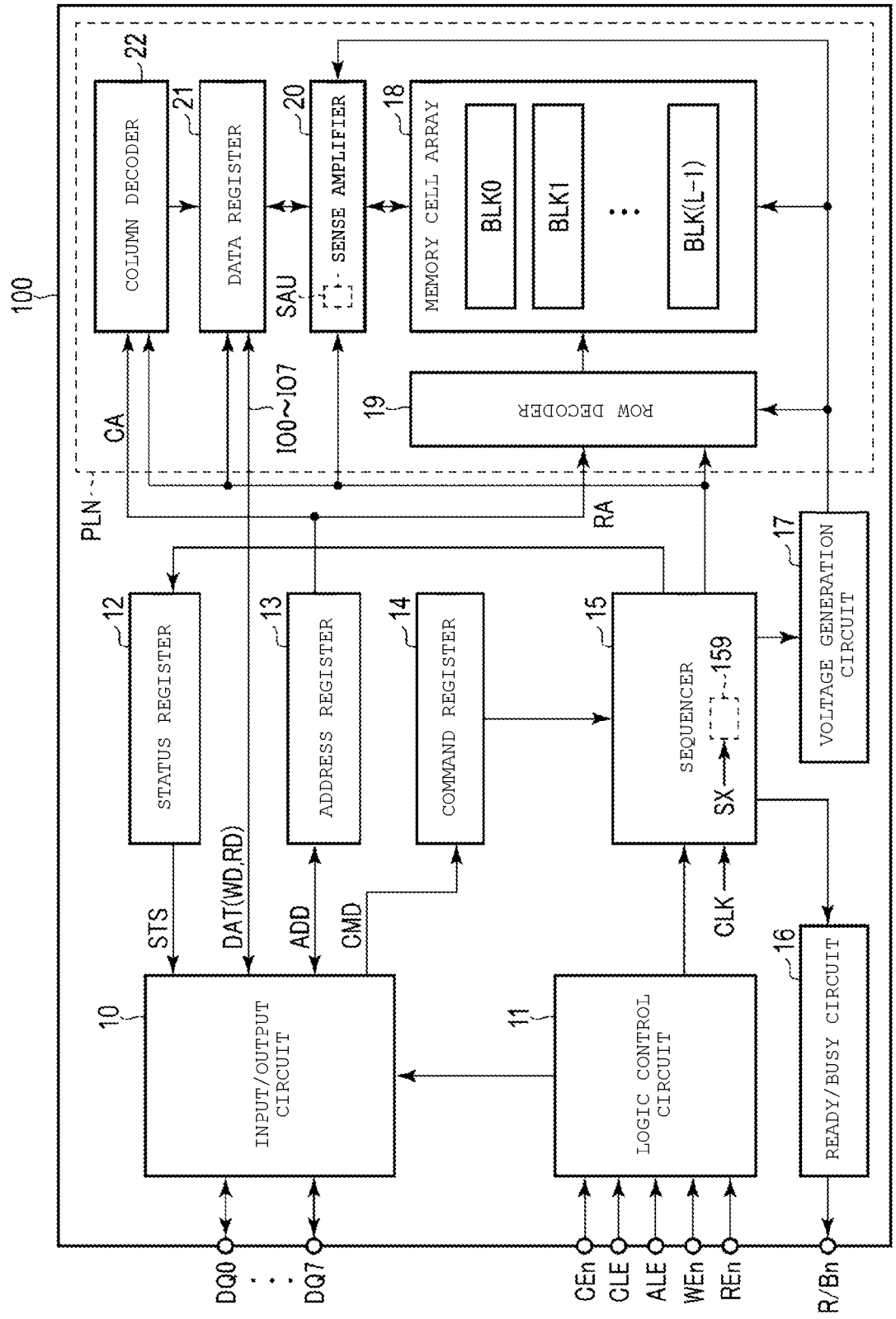
FIG. 2 is a block diagram illustrating a semiconductor memory according to the first embodiment.

FIG. 2 is a block diagram illustrating the semiconductor memory of the embodiment.

As illustrated in FIG. 2, the NAND flash memory 100 includes an input/output circuit 10, a logic control circuit 11, a status register 12, an address register 13, a command register 14, a sequencer 15, a ready/busy circuit 16, a voltage generation circuit 17, a memory cell array 18, a row decoder 19, a sense amplifier 20, a data register 21, a column decoder 22, and the like.

The input/output circuit 10 controls an input or an output of the signal DQ with the controller 200. The input/output circuit 10 includes an input circuit and an output circuit.

The input circuit transmits data DAT (e.g., write data WD) received from the controller 200 to the data register 21. The input circuit transmits a received address ADD to the address register 13. The input circuit transmits a received command CMD to the command register 14.

The output circuit transmits status information STS received from the status register 12 to the controller 200. The output circuit transmits the data DAT (e.g., read data RD) received from the data register 21 to the controller 200. The output circuit transmits the address ADD received from the address register 13 to the controller 200.

The input/output circuit 10 and the data register 21 are connected with each other via a data bus. For example, the data bus includes eight data lines IO0 to IO7 corresponding to the signals DQ0 to DQ7. The number of the data lines IO is not limited to eight and can be set to any.

The logic control circuit 11 receives, for example, the chip enable signal CEn, the command latch enable signal CLE, the address latch enable signal ALE, the write enable signal WEn, and the read enable signal REn from the controller 200. The logic control circuit 11 controls the input/output circuit 10 and the sequencer 15 according to the received signal.

The status register 12 temporally holds, for example, the status information STS on writing, reading, and erasing operations of the data. According to the status information STS, whether or not the operation is normally completed is notified to the controller 200.

The address register 13 temporally holds the address ADD received from the controller 200 via the input/output circuit 10. The address register 13 transmits a row address RA to the row decoder 19 and transmits a column address CA to the column decoder 22.

The command register 14 temporally holds the command CMD received from the controller 200 via the input/output circuit 10. The command register 14 transmits the received command CMD to the sequencer 15.

The sequencer 15 controls the overall operation of the NAND flash memory 100. According to the command CMD held in the command register 14, the sequencer 15 controls, for example, the status register 12, the ready/busy circuit 16, the voltage generation circuit 17, the row decoder 19, the sense amplifier 20, the data register 21, the column decoder 22, and the like. Accordingly, the sequencer 15 executes the writing operation, the reading operation, the erasing operation, and the like.

For example, a clock signal CLK is supplied to the sequencer 15. The clock signal CLK is generated based on a signal supplied from the controller 200 or another clock signal from the controller 200.

In the NAND flash memory 100 of the embodiment, the sequencer 15 includes a count circuit (counter) 159.

The count circuit 159 is activated based on a condition signal SX. The activated count circuit 159 executes a counting process based on the clock signal CLK. The sequencer 15 controls the ready/busy circuit 16 according to a count number by the counting process. Accordingly, the signal level of the ready/busy signal R/Bn is controlled.

The condition signal SX is a signal generated or controlled by the sequencer 15. The signal level of the condition signal SX is controlled according to an operation status of the memory cell array 18, the row decoder 19, the sense amplifier 20, the data register 21, or the like.

The ready/busy circuit 16 controls the signal level of the ready/busy signal R/Bn by control of the sequencer 15 in accordance with an operation status of the NAND flash memory 100. The ready/busy circuit 16 transmits the ready/busy signal R/Bn to the controller 200.

The voltage generation circuit 17 generates a voltage used for the writing operation, the reading operation, and the erasing operation according to the control of the sequencer 15. The voltage generation circuit 17 supplies the generated voltage to, for example, the memory cell array 18, the row decoder 19, the sense amplifier 20, and the like. The row decoder 19 and the sense amplifier 20 apply the voltage supplied by the voltage generation circuit 17 to a memory cell in the memory cell array 18.

The memory cell array 18 includes a plurality of blocks BLK (BLK0, BLK1, . . . , and BLK(L−1)) (L is integer equal to or more than two). Each of the blocks BLK includes the non-volatile memory cells associated with rows and columns (hereinafter, also referred to as memory cell transistors). Each of the blocks BLK includes a plurality of string units SU (SU0, SU1, SU2, SU3, . . . ). Each of the string units SU includes a plurality of NAND strings SR.

The number of the blocks BLK in the memory cell array 18 and the number of the string units SU in the block BLK are set freely.

A structure of the memory cell array 18 may be a two-dimensional structure in which the memory cells are two-dimensionally arranged or a three-dimensional structure in which the memory cells are three-dimensionally arranged. The details of the memory cell array 18 will be described below.

The row decoder 19 decodes the row address RA. The row decoder 19 selects any one of the blocks BLK and any one of the string units SU based on a decoding result. The row decoder 19 applies a voltage for the operation to the block BLK.

The sense amplifier 20 senses the data read from the memory cell array 18 during the reading operation. The sense amplifier 20 transmits the read data RD to the data register 21. The sense amplifier 20 transmits the write data WD to the memory cell array 18 during the writing operation.

For example, the sense amplifier 20 includes a plurality of sense amplifier units SAU. A configuration of the sense amplifier 20 will be described below.

The data register 21 includes a plurality of latch circuits. The latch circuit holds the write data WD and the read data RD. For example, in the writing operation, the data register 21 temporally holds the write data WD received from the input/output circuit 10 and transmits the write data WD to the sense amplifier 20. For example, in the reading operation, the data register 21 temporally holds the read data RD received from the sense amplifier 20 and transmits the read data RD to the input/output circuit 10.

The column decoder 22 decodes the column address CA. The column decoder 22 selects the latch circuit in the data register 21 according to the decoding result.

In some cases, the NAND flash memory 100 may include a control unit called a plane PLN. For example, the one plane PLN includes the memory cell array 18, the row decoder 19, the sense amplifier 20, the data register 21, and the column decoder 22.

In the example of FIG. 2, the NAND flash memory 100 includes one plane PLN. However, the NAND flash memory 100 may include two or more planes PLN. In a case where the NAND flash memory 100 includes a plurality of planes PLN, the planes PLN can respectively execute different operations at different timings by the control of the sequencer 15.

Memory Cell Array

Figure 3:
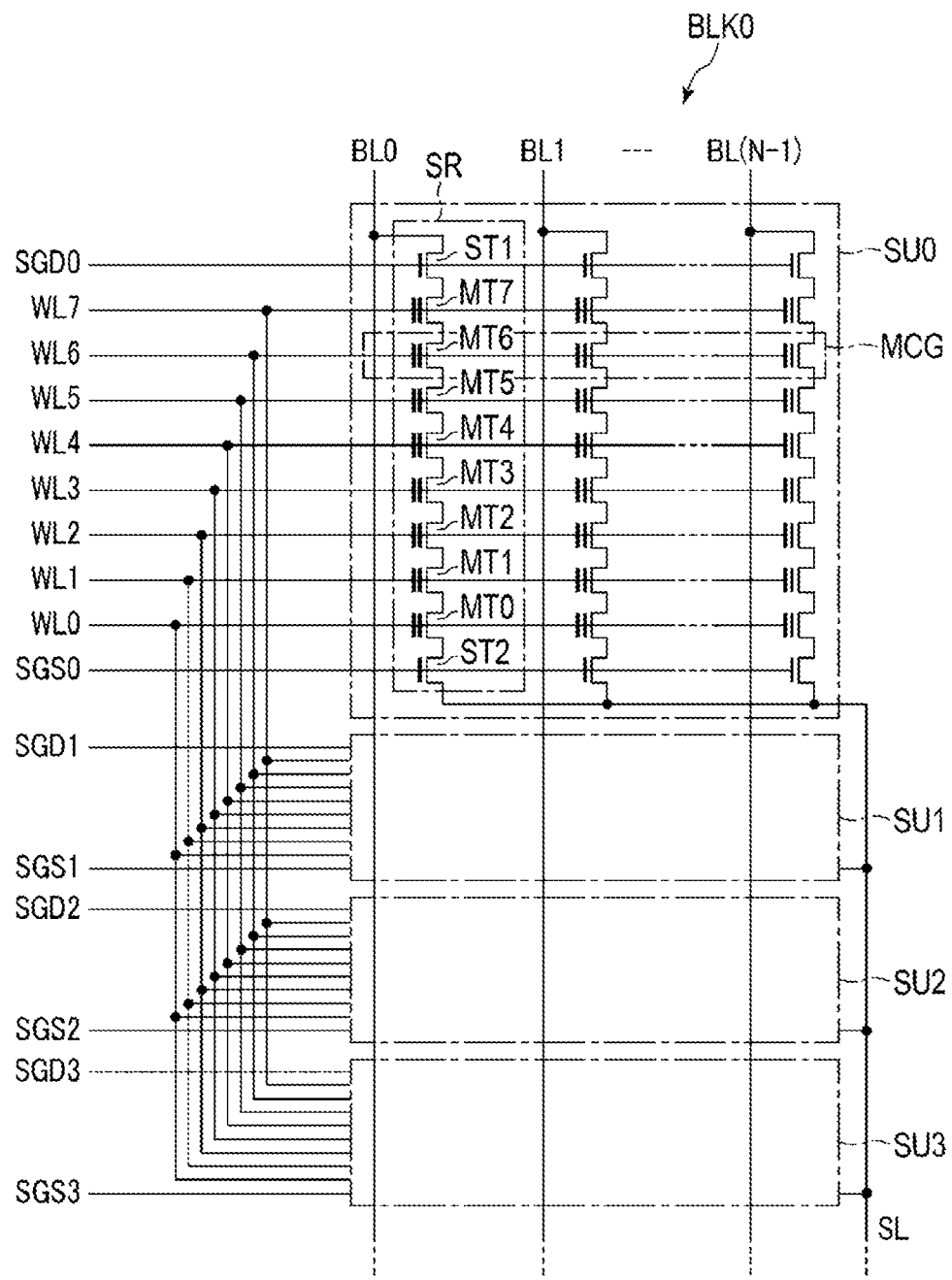
FIG. 3 is an equivalent circuit diagram illustrating an internal configuration of the semiconductor memory according to the first embodiment.

FIG. 3 is an equivalent circuit diagram illustrating an example of a memory cell array of the semiconductor memory of the embodiment.

The example of FIG. 3 illustrates the block BLK0, but the configuration of other blocks BLK is the same.

As illustrated in FIG. 3, the block BLK0 includes, for example, the four string units SU (SU0 to SU3). Each of the string units SU includes the plurality of NAND strings SR. Each of the NAND strings SR includes, for example, eight memory cells MT0 to MT7 and two select transistors ST1 and ST2. Hereinafter, in a case where it is unnecessary to distinguish the memory cells MT0 to MT7, the memory cells MT0 to MT7 are referred to as a memory cell MT. The number of the memory cells MT in the NAND string SR is not limited to eight and can be set to any number. The number of the select transistors ST1 and ST2 in the NAND string SR is set freely and may be equal to or more than one.

The memory cell MT includes a control gate and a charge storage layer. Accordingly, the memory cell MT holds data in a non-volatile manner. The memory cell MT may be a MONOS type using an insulating layer (for example, silicon nitride film) for the charge storage layer or may be a floating gate type using a conductive layer (for example, silicon film) for the charge storage layer.

A plurality of memory cells MT are connected in series between a source of the select transistor ST1 and a drain of the select transistor ST2. Current paths of the memory cells MT0 to MT7 are connected in series. A terminal (for example, drain) of the current path of the memory cell MT7 is connected to the source of the select transistor ST1. A terminal (for example, source) of the current path of the memory cell MT0 is connected to the drain of the select transistor ST2.

Gates of the select transistors ST1 of the string units SU0 to SU3 are respectively connected with select gate lines SGD0 to SGD3. In the same manner, gates of the select transistors ST2 of the string units SU0 to SU3 are respectively connected with select gate lines SGS0 to SGS3. Hereinafter, in a case where it is unnecessary to distinguish the select gate lines SGD0 to SGD3, the select gate lines SGD0 to SGD3 are referred to as a select gate line SGD. In a case where it is unnecessary to distinguish the select gate lines SGS0 to SGS3, the select gate lines SGS0 to SGS3 are referred to as a select gate line SGS. Each of the string units SU may be commonly connected to the one select gate line SGS.

The control gates of the memory cells MT0 to MT7 in the block BLK are commonly connected to word lines WL0 to WL7 respectively. Hereinafter, in a case where it is unnecessary to distinguish the word lines WL0 to WL7, the word lines WL0 to WL7 are referred to as a word line WL.

Drains of the select transistors ST1 of each of the NAND strings SR in the string unit SU are connected to different bit lines BL0 to BL(N−1) (N is integer equal to or more than two). Hereinafter, in a case where it is unnecessary to distinguish the bit lines BL0 to BL(N−1), the bit lines BL0 to BL(N−1) are referred to as a bit line BL. Each of the bit lines BL is commonly connected to one NAND string SR in each of the string units SU across the plurality of blocks BLK. Source of a plurality of select transistors ST2 are commonly connected to a source line SL.

The string unit SU is an aggregation of the NAND strings SR which are connected with different bit lines BL and the same select gate lines SGD and SGS.

The block BLK is an aggregation of the plurality of string units SU having common word lines WL. The memory cell array 18 is an aggregation of the plurality of blocks BLK having common bit lines BL.

Writing and reading of the data are collectively performed on the memory cell MT connected to any one of the word lines WL in any one of the string units SU. Hereinafter, when writing and reading the data, a group of the memory cells MT collectively selected is referred to as a memory cell group MCG. Aggregation of the 1-bit data to be written to or read from the one memory cell group MCG is referred to as a page. For example, a plurality of pages are allocated to the one memory cell group MCG.

The data can be erased in a block BLK unit or a unit smaller than the block BLK. A method for erasing the data is described, for example, in U.S. patent application Ser. No. 13/235,389, filed on Sep. 18, 2011 and entitled "NON-VOLATILE SEMICONDUCTOR MEMORY DEVICE." In addition, a method for erasing the data is described, in U.S. patent application Ser. No. 12/694,690, filed on Jan. 27, 2010 and entitled "NON-VOLATILE SEMICONDUCTOR STORAGE DEVICE." Further, a method for erasing the data is described in U.S. patent application Ser. No. 13/483,610, filed on May 30, 2012 and entitled "NONVOLATILE SEMICONDUCTOR MEMORY DEVICE AND DATA ERASE METHOD THEREOF." These patent applications are incorporated herein by reference in their entirety.

The memory cell array 18 may have another configuration. A configuration of the memory cell array 18 having another configuration is described in U.S. patent application Ser. No. 12/407,403, filed on Mar. 19, 2009 and entitled "THREE DIMENSIONAL STACKED NONVOLATILE SEMICONDUCTOR MEMORY." Other configurations of the memory cell array 18 are described in U.S. patent application Ser. No. 12/406,524, filed on Mar. 18, 2009 and entitled "THREE DIMENSIONAL STACKED NON-VOLATILE SEMICONDUCTOR MEMORY," U.S. patent application Ser. No. 12/679,991, filed on Mar. 25, 2010 and entitled "NON-VOLATILE SEMICONDUCTOR STORAGE DEVICE AND METHOD OF MANUFACTURING THE SAME," and U.S. patent application Ser. No. 12/532,030, filed on Mar. 23, 2009 and entitled "SEMICONDUCTOR MEMORY AND METHOD FOR MANUFACTURING SAME." All of the above patent applications are incorporated herein by reference in their entirety.

Sense Amplifier Circuit and Data Register

Figure 4:
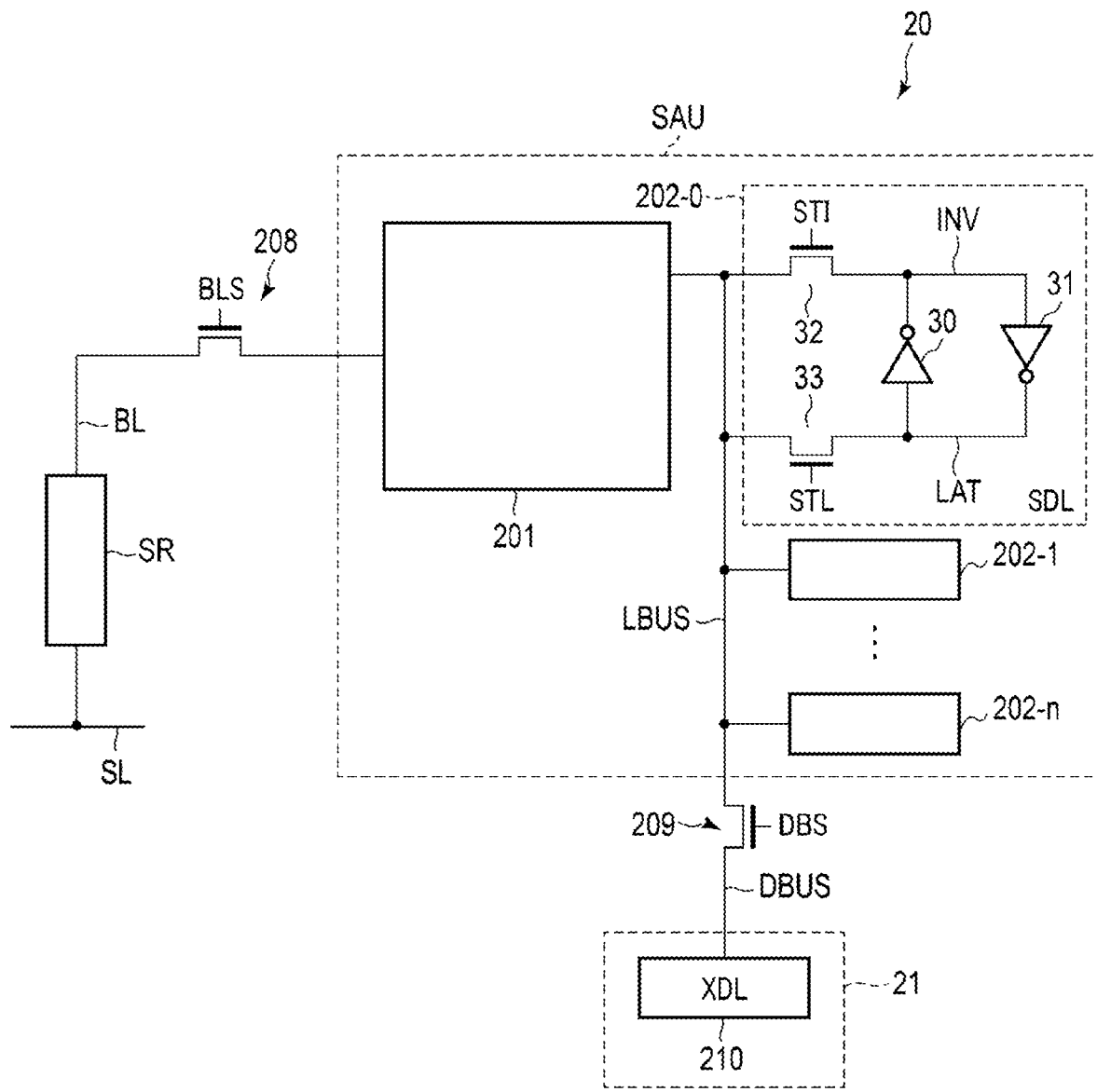
FIG. 4 is a block diagram illustrating the internal configuration of the semiconductor memory according to the first embodiment.

FIG. 4 is a block diagram illustrating an example of a sense amplifier and a data register of the semiconductor memory of the embodiment.

The sense amplifier 20 includes the plurality of sense amplifier units SAU. The plurality of sense amplifier units SAU are provided corresponding to each of the bit lines BL. The example of FIG. 4 illustrates the sense amplifier unit SAU corresponding to the one bit line BL.

As illustrated in FIG. 4, the sense amplifier unit SAU includes a sense circuit 201, one or more latch circuits 202 (202-0, 202-1, . . . , and 202-n), and the like.

At the time of writing the data, the sense circuit 201 controls a voltage of the bit line BL according to the data held in the latch circuit 202.

At the time of reading the data, the sense circuit 201 senses a current or the voltage of the bit line BL. The sense circuit 201 transmits a signal based on the sensed result to the latch circuit 202.

The latch circuit 202 holds the write data WD and the read data RD.

For example, in a case where the memory cell MT executes a multi-value operation of holding the data of 2 or more bits, the sense amplifier unit SAU includes a plurality of latch circuits 202. The plurality of latch circuits 202 is connected with a bus LBUS for transmitting or receiving the data. Each of the latch circuits 202 holds 1-bit data.

For example, among the plurality of latch circuits 202, the latch circuit (SDL) 202-0 is used for transmitting the data between the sense amplifier 20 and the data register 21.

At the time of the writing operation, the 1-bit data included in the write data WD is transmitted from the data register 21 to the latch circuit 202-0. The 1-bit data of the latch circuit 202-0 is transmitted to the corresponding latch circuits 202-1 to 202-n.

At the time of the reading operation, a calculation process is performed on the signals of the latch circuits 202-1 to 202-n, so that the read data RD is confirmed. The confirmed read data RD is stored in the latch circuit 202-0. The read data RD is transmitted from the latch circuit 202-0 to the data register 21.

For example, the latch circuit (SDL) 202-0 includes inverters 30 and 31, and field effect transistors (for example, n-channel MOS transistors) 32 and 33.

An input node of the inverter 30 is connected to a node LAT and an output node of the inverter 30 is connected to a node INV. An input node of the inverter 31 is connected to the node INV and an output node of the inverter 31 is connected to the node LAT.

One end of the transistor 32 is connected to the node INV and the other end of the transistor 32 is connected to the bus LBUS. A control signal STI is input to a gate of the transistor 32. One end of the transistor 33 is connected to the node LAT and the other end of the transistor 33 is connected to the bus LBUS. A control signal STL is input to a gate of the transistor 33.

For example, the data held in the node LAT corresponds to the data held in the latch circuit 202-0 and the data held in the node INV corresponds to reverse data of the data held in the node LAT.

By control of the signal level of the control signals STI and STL, an input or an output of the data of the latch circuit 202 is executed.

The latch circuit 202 having such an internal configuration performs a digital operation.

The circuit configurations of the latch circuits 202-1 to 202-n are the same as the circuit configuration of the latch circuit 202-0, and thus the description thereof will be omitted.

In the present embodiment, the sense amplifier unit SAU may be a current sensing circuit which senses a current flowing through the bit line BL or may be a voltage sensing circuit which senses the voltage of the bit line BL.

An internal configuration of the sense circuit 201 varies according to a sensing method of the sense amplifier unit SAU. Therefore, the detail description of the internal configuration of the sense circuit 201 will be omitted.

The data register 21 includes a plurality of latch circuits (XDL) 210. The latch circuit 210 is provided corresponding to each of the sense amplifier units SAU. The latch circuit 210 is used as a data cache circuit.

The latch circuit 210 temporally holds the read data RD received from the sense amplifier unit SAU and the write data WD received from the input/output circuit 10. The write data WD is transmitted from the input/output circuit 10 to the sense amplifier unit SAU via the latch circuit 210. The read data RD is transmitted from the sense amplifier unit SAU to the input/output circuit 10 via the latch circuit 210.

For example, the circuit configuration of the latch circuit 210 is substantially the same as the circuit configuration of the latch circuit 202-0.

The sense amplifier unit SAU is connected with the bit line BL via a field effect transistor 208.

The transistor 208 controls connection between the bit line BL and the sense amplifier unit SAU. One end (one of source/drain of transistor 208) of the transistor 208 is connected to the corresponding bit line BL and the other end (other of source/drain of transistor 208) of the transistor 208 is connected to the sense amplifier unit SAU via corresponding wiring. A signal BLS is input to a gate of the transistor 208. The signal BLS is a signal for controlling electrical connection between the bit line BL and the sense amplifier unit SAU.

The transistor 208 is, for example, a high-breakdown voltage n-channel MOS transistor.

The sense amplifier unit SAU is connected with the latch circuit 210 of the data register 21 via a field effect transistor 209.

The transistor 209 is connected with the bus LBUS and a bus DBUS. The transistor 209 controls connection between the sense amplifier unit SAU and the latch circuit 210 in the data register 21.

One end of the transistor 209 is connected to the bus LBUS and the other end of the transistor 209 is connected to the latch circuit 210 via the bus DBUS. A signal DBS is input to a gate of the transistor 209. The signal DBS is a signal for controlling electrical connection between the bus LBUS and the bus DBUS or more generally electrical connection between sense amplifier unit SAU and data register 21.

The transistor 209 is, for example, a low-breakdown voltage n-channel MOS transistor.

Count Circuit

Figure 5:
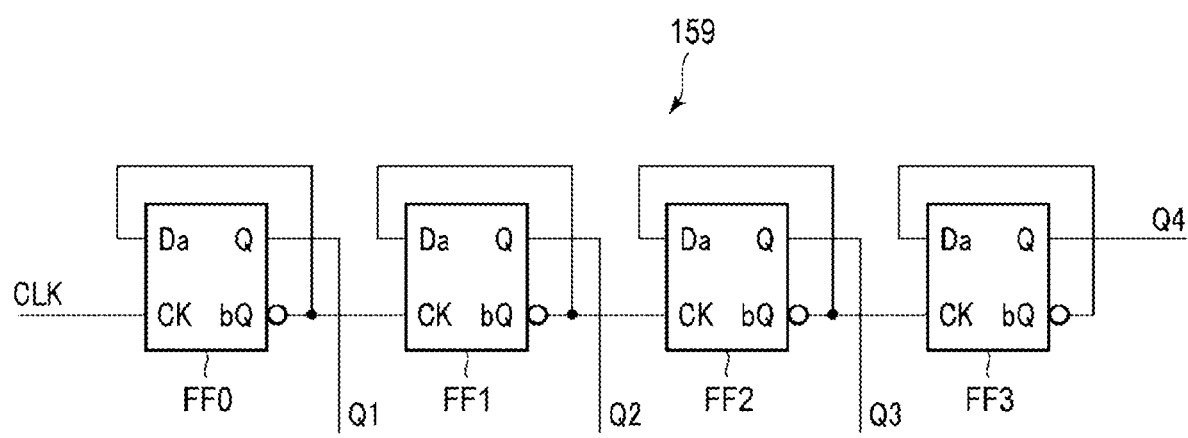
FIG. 5 is a block diagram illustrating a count circuit of the semiconductor memory according to the first embodiment.

FIG. 5 is a block diagram illustrating a count circuit of the semiconductor memory of the embodiment.

As illustrated in FIG. 5, the count circuit 159 includes a plurality of flip-flop circuits FF (FF0, FF1, FF2, and FF3) connected in series. For example, in the example of FIG. 5, the count circuit 159 includes four D-type flip-flop circuits FF. The number of the flip-flop circuits FF is not limited to four. Any number of the flip-flop circuits FF can be used.

Each of the flip-flop circuits FF includes two input terminals Da and CK, and two output terminals Q and bQ. A signal of the output terminal bQ is a reverse signal of a signal of the output terminal Q.

Among the four flip-flop circuits FF, the clock signal CLK is supplied to a first input terminal CK (which is clock input terminal) of a flip-flop circuit FF0 at a first stage. A first output terminal Q of the flip-flop circuit FF0 outputs a signal Q1. A second output terminal bQ of the flip-flop circuit FF0 is connected to a second input terminal Da (which is a data input terminal) of the flip-flop circuit FF0 and is connected to the input terminal CK of a flip-flop circuit FF1 at a second stage.

The output terminal Q of the flip-flop circuit FF1 at the second stage outputs a signal Q2. The output terminal bQ of the flip-flop circuit FF1 is connected to the input terminal Da of the flip-flop circuit FF1 and is connected to the input terminal CK of a flip-flop circuit FF2 at a third stage.

The output terminal Q of the flip-flop circuit FF2 at the third stage outputs a signal Q3. The output terminal bQ of the flip-flop circuit FF2 is connected to the input terminal Da of the flip-flop circuit FF2 and is connected to the input terminal CK of a flip-flop circuit FF3 at a fourth stage.

The output terminal Q of the flip-flop circuit FF3 at the fourth stage outputs a signal Q4. The output terminal bQ of the flip-flop circuit FF3 is connected to the input terminal Da of the flip-flop circuit FF3.

The flip-flop circuit FF0 at the first stage outputs a value of the input terminal Da from the output terminal Q as the signal Q1 in synchronization with the clock signal CLK (for example, rising edge of clock signal CLK).

In the flip-flop circuits FF1 to FF3 at the second to fourth stages, a negative logic signal (signal having same phase as signal Q) of the signal of the output terminal bQ of the flip-flop circuit at the preceding stage is supplied to the flip-flop circuit of the subsequent stage.

The flip-flop circuits FF1 to FF3 respectively output values of the input terminal Da from the output terminal Q as the signals Q2 to Q4 in synchronization with the signal (for example, rising edge of signal) supplied to the input terminal CK.

The count circuit 159 outputs a 4-bit count value by the signals Q1 to Q4. In this way, the circuit in FIG. 5 forms an asynchronous count circuit.

Further, the number of flip-flop circuits FF constituting the count circuit 159 is appropriately changed according to the number of bits of the count value.

The memory system and the flash memory of the present embodiment have the configurations of FIGS. 1 to 5 as described above.

In the memory system of the present embodiment, at the time of reading the data in the NAND flash memory, the data transmitted from the sense amplifier 20 to the data register is transmitted from the data register 21 to the controller 200 according to a command (for example, register read command or data output command from data register 21 to controller 200) from the controller 200.

The command from the controller 200 is transmitted from the controller 200 to the NAND flash memory 100 for a time period when the ready/busy signal R/Bn is at the ready state (time period when signal level of ready/busy signal R/Bn is "L" level).

In the memory system of the present embodiment, a state (represented by a signal level) of the ready/busy signal R/Bn is controlled based on a result of the counting process of the count circuit 159 of the NAND flash memory 100.

During transmitting the data from the latch circuit (SDL) 202 of the sense amplifier 20 to the latch circuit (XDL) 210 of the data register 21, the ready/busy circuit 16 changes the state of the ready/busy signal R/Bn from the busy state to the ready state at a timing at which the count value of the count circuit 159 reaches a certain value (e.g., setting value).

The timing at which the state of the ready/busy signal R/Bn is changed from the busy state to the ready state can be controlled by adjusting the count value of the count circuit 159.

When the ready/busy signal R/Bn is set to the ready state, the controller 200 transmits the command for transmitting the data to the controller 200 to the NAND flash memory 100. In the present embodiment, the timing at which the controller 200 transmits the command for transmitting the data to the controller 200 to the NAND flash memory 100 is overlapped with at least a part of the time period when the data is transmitted between the latch circuits 202 and 210 in the NAND flash memory 100.

In the present embodiment, the NAND flash memory 100 transmits the data in the data register 21 to the controller 200 according to the command received during the time period when the data is transmitted between the latch circuits 202 and 210.

Accordingly, in the memory system of the present embodiment, as compared with a case where the ready/busy signal R/Bn is set to the ready state after the data transmission between the latch circuits 202 and 210 is completed, the timing of the command transmission/reception and the timing of the data output to the controller can become faster.

Therefore, the NAND flash memory of the present embodiment and the memory system including the NAND flash memory can speed up data transmission.

(b) Operation Example

An operation example of the memory system and the flash memory according to the present embodiment will be described with reference to FIGS. 6 to 9. Here, in addition to FIGS. 6 to 9, FIGS. 1 to 5 are appropriately used in order to explain the operation example of the memory system and the semiconductor memory of the present embodiment.

Figure 6:
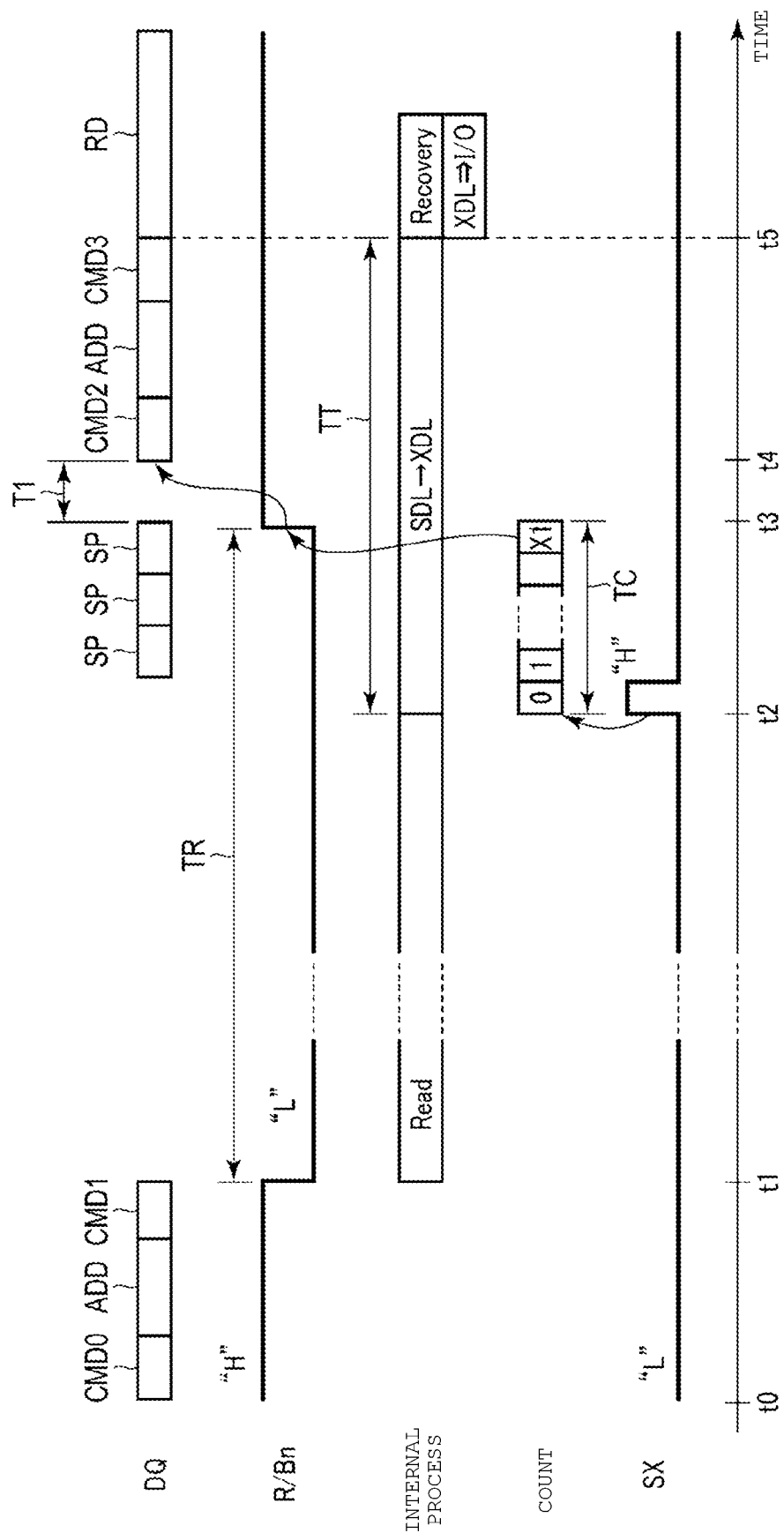
FIG. 6 is a timing chart illustrating an operation example of the memory system according to the first embodiment.

FIG. 6 is a timing chart illustrating the operation example of the memory system and the semiconductor memory according to the present embodiment. FIG. 6 respectively illustrates transition of the signal levels of the signal DQ, R/Bn, and SX, a status of an internal process of the NAND flash memory, and transition of the count value with respect to time.

Figure 7:
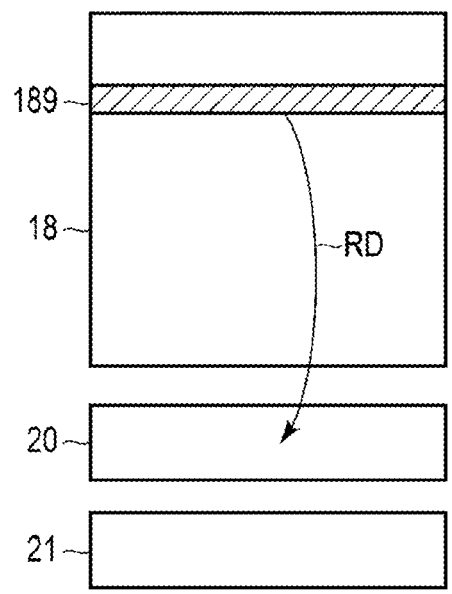
FIG. 7 is a schematic diagram illustrating the operation example of the memory system according to the first embodiment.
Figure 8:
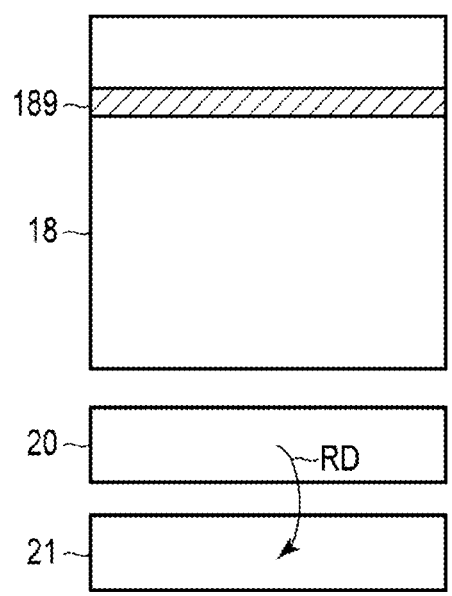
FIG. 8 is a schematic diagram illustrating the operation example of the memory system according to the first embodiment.
Figure 9:
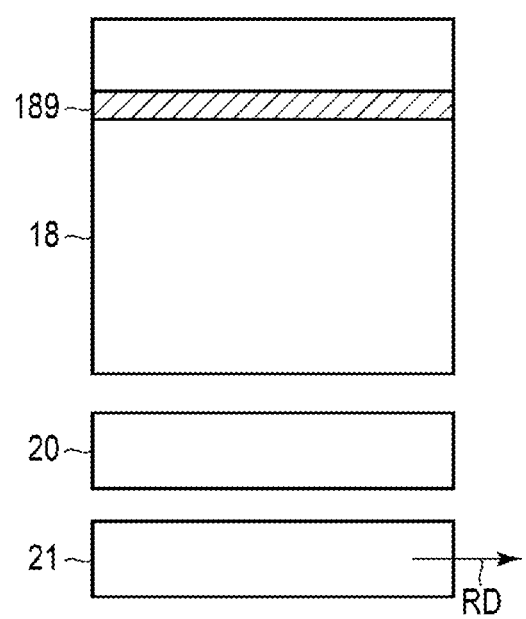
FIG. 9 is a schematic diagram illustrating the operation example of the memory system according to the first embodiment.

Each of FIGS. 7 to 9 is a schematic diagram illustrating a state of data transmission in the NAND flash memory at the time of reading the data of the memory system.

As described below, the memory system and the semiconductor memory of the present embodiment execute reading of the data.

Time t0

As described in FIG. 6, the controller 200 transmits a command sequence related to the reading of the data to the NAND flash memory 100 according to a request from the host device 2.

In a case of the reading of the data in the memory cell array 18, as described below, the controller 200 starts to transmit a command CMD0, the address ADD, and a command CMD1 to the NAND flash memory 100 at a time t0.

The controller 200 transmits the command CMD0 of "00h" to the NAND flash memory 100 and sets the signal level of the command latch enable signal CLE to the "H" level. "00h" is a command for notifying execution of the data reading from the memory cell array 18. "00h" indicates that the read address is to be input.

The NAND flash memory 100 stores the command CMD0 in the command register 14.

The controller 200 then transmits the address ADD and sets the signal level of the address latch enable signal ALE to the "H" level. The address ADD indicates the address of the page from which the data is read.

The NAND flash memory 100 stores the address ADD in the address register 13.

For example, the address ADD includes the column address CA for two cycles and the row address RA for four cycles (or for three cycles). The number of cycles of the column address CA and the row address RA can be freely determined according to the number of the blocks, the number of the string units, and the number of the bit lines of the memory cell array 18.

The controller 200 transmits the command CMD1 of "30h" and sets the signal level of the command latch enable signal CLE to the "H" level. "30h" is a command for instructing execution of the data reading from the memory cell array 18.

The NAND flash memory 100 stores the command CMD1 in the command register 14.

Time t1

At a time t1, the NAND flash memory 100 accesses the memory cell array 18 and starts to read the data from the page indicated by the address ADD according to the commands CMD0 and CMD1 of "00h" and "30h".

At this time, the signal level of the ready/busy signal R/Bn is set to the "L" level (which is the busy state).

When the NAND flash memory 100 starts to read the data, the NAND flash memory 100 maintains the signal level of the ready/busy signal at the "L" level. The time period when the signal level of the ready/busy signal is maintained to be the "L" level is referred to as a time period TR. On the other hand, the NAND flash memory 100 internally executes various well-known internal operations to read from the selected address ADD.

As an example of the internal operation of the NAND flash memory 100, the voltage generation circuit 17 generates various voltage such as a read voltage and the like for the reading operation. The row decoder 19 activates the selected block, the selected string unit, and the selected word line based on the row address RA of the selected address ADD.

The read voltage is applied to the selected word line. The number of times that the read voltage is applied to the selected word line and a voltage value of the read voltage are different according to the address of the page to be read.

The sense amplifier 20 senses a current (or voltage of bit line) generated in the bit line. Accordingly, as described in FIG. 7, the sense amplifier 20 reads the data from a page 189 indicated by the selected address ADD.

Each of the latch circuits 202 holds the sensed result in accordance with the read voltage.

A calculation process is performed on the sensed result of each of the latch circuits 202 so that the read data is confirmed. The confirmed read data RD is held in the latch circuit (SDL) 202-0.

Time t2 to Time t3

After the data RD read from the memory cell array 18 and confirmed is held in the latch circuit (SDL) 202-0, the sense amplifier 20 starts to transmit the read data RD to the data register 21 at a time t2.

As illustrated in FIG. 8, the read data RD is transmitted from the latch circuit (SDL) 202-0 of the sense amplifier 20 to the latch circuit (XDL) 210 of the data register 21.

In the following, a time period required until the data is transmitted from the latch circuit (SDL) 202-0 of the sense amplifier 20 to the latch circuit (XDL) 210 of the data register 21 is completed is referred to as a time period TT.

In the present embodiment, the condition signal SX is activated in synchronization with the timing (time t2) at which the data is started to be transmitted from the latch circuit (SDL) 202 to the latch circuit (XDL) 210. By activating a condition signal CS, the signal level of the condition signal SX transitions from the "L" level to the "H" level.

The count circuit 159 starts to perform the counting process in response to the activated condition signal SX.

During the counting process, the count circuit 159 increments the held value in synchronization with the clock signal CLK. In the counting process of the count circuit 159, the count value reaches a setting value X1 which is a predetermined value as a time period TC elapses.

For example, the time period TC from the start of the counting process in the count circuit 159 until the count value reaches the predetermined setting value X1 is shorter than the time period TT from the start to the end of the data transmission (data transmission from sense amplifier 20 to data register 21) between the two latch circuits 202 and 210.

The sequencer 15 controls the ready/busy circuit 16 so as to change the signal level of the ready/busy signal R/Bn at a timing (for example, time t3) at which the count value of the count circuit 159 reaches the setting value X1.

The ready/busy circuit 16 changes the signal level of the ready/busy signal R/Bn from the "L" level (which is the busy state) to the "H" level (which is the ready state) at the time t3 by control of the sequencer 15 based on the result of the counting process.

The timing at which the signal level of the ready/busy signal R/Bn is changed from the "L" level to the "H" level can be changed by adjusting magnitude of the setting value X1 of the count value of the count circuit 159.

The controller 200 executes status polling, for example, during the time period when the signal level of the ready/busy signal is maintained to be at the "L" level after the reading of the data is started, that is, the time period TR.

The controller 200 transmits a status read command SP a plurality of times during the status polling. The NAND flash memory 100 transmits the status information STS in the status register 12 to the controller 200 in response to the status read command.

When detecting that the ready/busy signal R/Bn is returned to the "H" level (which is the ready state) based on the status information STS, the controller 200 determines that the time period TR is completed and transmits the register read command to the NAND flash memory 100 as described below.

Time t4 to Time t5

After a time period T1 elapses since the ready/busy signal R/Bn is set to the "H" level, at a time t4, the controller 200 transmits a command CMD2 of "05h" to the NAND flash memory 100 and sets the command latch enable signal CLE to the "H" level. "05h" is a command for notifying execution of the register read.

The NAND flash memory 100 stores the command CMD2 in the command register 14.

The controller 200 transmits the column address CA for two cycles and the row address RA for four cycles (or for three cycles) as the address ADD and sets the address latch enable signal ALE to the "H" level.

The NAND flash memory 100 stores the address ADD in the address register 13.

The controller 200 transmits a command CMD3 of "E0h" and sets the command latch enable signal CLE to the "H" level. "E0h" is a command for instructing execution of the register read.

The NAND flash memory 100 stores the command CMD3 in the command register 14.

The column address CA transmitted together with the command CMD0 and the column address CA transmitted together with the command CMD2 may be different with each other. The row address RA may be omitted in the address ADD to be read by the command CMD2.

Here, the sequencer 15 changes the signal level of the ready/busy signal R/Bn from the "L" level to the "H" level at a timing of the setting value X1 in the count circuit 159. In response to this, the command sequence of the register read is transmitted and received. The timing of the setting value X1 in the count circuit 159 needs to be set so that, for example, the timing at time t5 when transmission and reception (more specifically, reception of "E0h") of the command sequence of the register read is completed is approximately equal to the timing when the data transmission between the latch circuits 202 and 210 is completed.

The NAND flash memory 100 starts the register read according to the command of "E0h". The controller 200 transmits the read enable signal REn of the "L" level after a certain time period elapses since the write enable signal WEn corresponding to the command of "E0h" rises from the "L" level to the "H" level.

As illustrated in FIG. 9, the latch circuit 210 outputs the data RD in the data register 21. Accordingly, the NAND flash memory 100 transmits the read data RD in the data register 21 to the controller 200 based on the read enable signal REn via the input/output circuit 10.

In this way, at the time t5, the read data RD in the latch circuit (XDL) 210 is transmitted from the NAND flash memory 100 to the controller 200 via the input/output circuit 10 as prefetch data.

The transmission of the data RD from the latch circuit 210 to the input/output circuit 10 is performed in parallel with a recovery process of the operation of the NAND flash memory 100.

When the transmission of the data RD is completed, the latch circuit (XDL) 210 of the data register 21 becomes releasable.

For example, in the controller 200, the data RD is stored in the buffer memory 540 via the NAND interface circuit 550. For example, the ECC circuit 560 performs the ECC process on the data RD. The processor 530 transmits the data RD to the host device 2 via the host interface circuit 510.

As described above, the transmission of the data in the memory system and the semiconductor memory of the present embodiment is completed.

The command sequence for reading the data is not limited to the sequence including the commands CMD0 and CMD1 of "00h" and "30h". For example, as a response to the command of "31h" or the command of "3Fh", the reading operation including the data transmission from the latch circuit 202 to the latch circuit 210 may be executed.

"31h" is a command for instructing that the data read by the sense amplifier 20 is transmitted to the controller 200 via the data register 21 and the data of the next page of the page, of which the data is transmitted, is read.

"3Fh" is a command for transmitting the data read by the sense amplifier 20 immediately before to the controller 200 via the data register 21 without reading the data from the following page (for example, last page).

The transmission of the command CMD0 of "00h" and the address ADD may be omitted in the command sequence (command sequence of cache read) of "31h" and "3Fh".

In addition, in the present embodiment, the reading of the data from the NAND flash memory 100 may be a suspend read. The suspend read is a reading operation that sets the writing operation and the erasing operation that is executed to a suspend state.

For example, during the writing operation/the erasing operation, the suspend read is executed by transmitting or receiving the command sequence related to the reading of the data. After the operation being executed is set to the suspend state by a suspend command (for example, "A7h"), the suspend read may be executed by the command sequence related to the reading of the data.

(c) Summary

In the memory system and the semiconductor memory according to the present embodiment, after the data transmission is started from the latch circuit in the sense amplifier to the latch circuit of the data register, the NAND flash memory 100 changes the signal level of the ready/busy signal from the "L" level to the "H" level before the data transmission is completed. The timing at which the signal level of the ready/busy signal transitions from the "L" level to the "H" level corresponds to the timing of the setting value X1 in the count circuit 159.

Accordingly, in the memory system and the semiconductor memory according to the present embodiment, the semiconductor memory (for example, flash memory) can indicate that the command for instructing the output of the data from the data register can be transmitted with respect to the controller in parallel with the data transmission at a timing before the data transmission between the latch circuit of the sense amplifier and the latch circuit of the data register in the semiconductor memory is completed. In response to this, the controller can transmit the command for instructing the output of the data from the data register to the semiconductor memory in parallel with the data transmission between the latch circuit of the sense amplifier and the latch circuit of the data register in the semiconductor memory.

As a result, in the memory system and the semiconductor memory according to the present embodiment, the semiconductor memory provides high speed of the data transmission as compared to a case where the command for instructing the output of the data from the data register can be transmitted with respect to the controller after the data transmission between the latch circuit of the sense amplifier and the latch circuit of the data register in the semiconductor memory is completed.

(2) Second Embodiment

The memory system and the semiconductor memory according to the second embodiment will be described with reference to FIG. 10.

Figure 10:
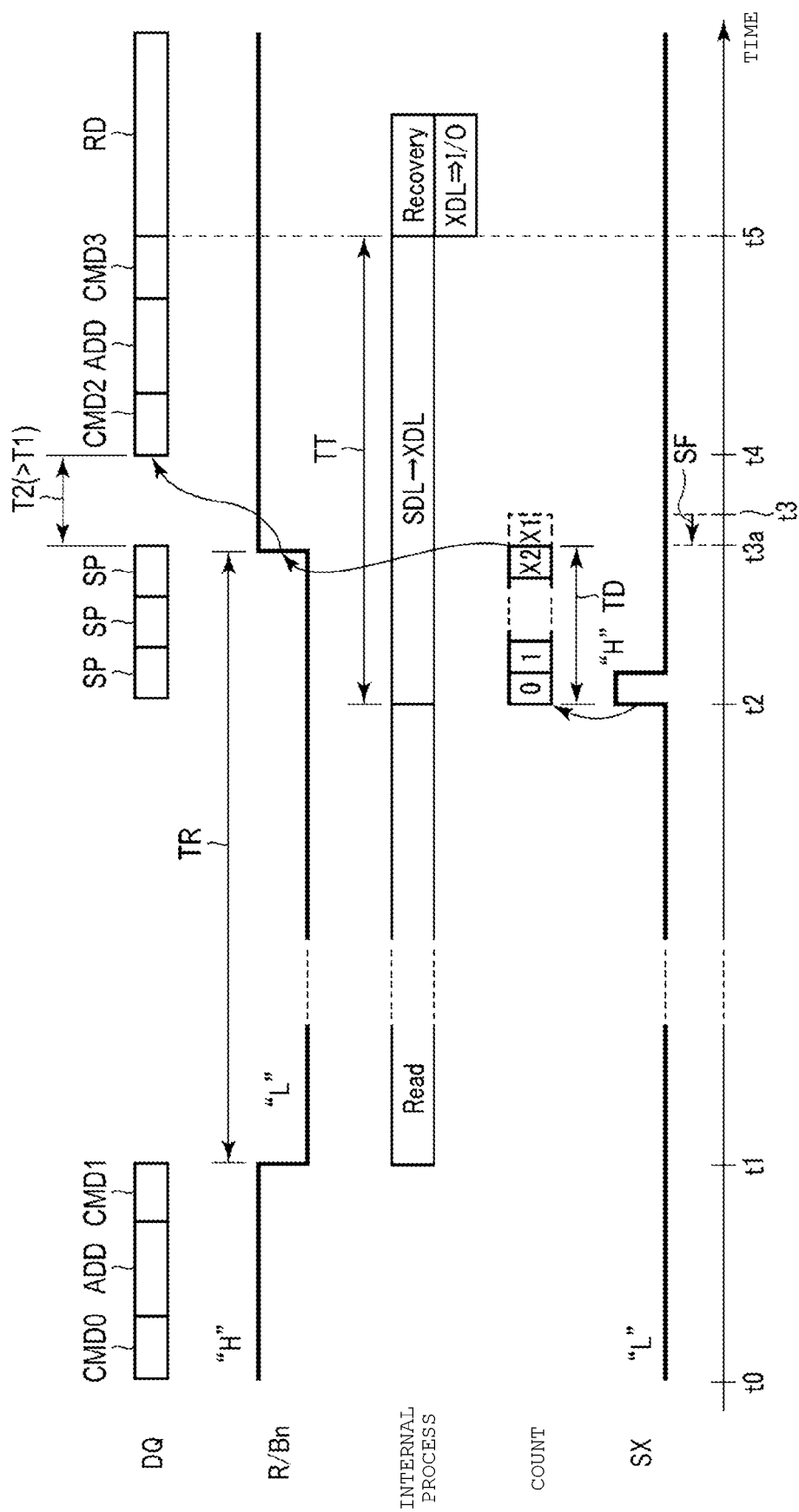
FIG. 10 is a timing chart illustrating an operation example of a memory system according to a second embodiment.

FIG. 10 is a timing chart illustrating an operation example of the memory system and the semiconductor memory according to the second embodiment.

As described above, for the time period TR, the controller 200 continuously transmits the status read command SP to the NAND flash memory 100 so as to execute the status polling.

Accordingly, the controller 200 can detect an operation status inside the NAND flash memory 100.

According to the configuration (e.g., specification and/or performance) of the memory system, a cycle of the status polling may be different in some cases. In addition, according to the configuration of the memory system, the time period when the command sequence for the register read is transmitted or received may be different in some cases.

In the example illustrated in FIG. 10, a time period T2 since the ready/busy signal R/Bn is set to the "L" level until the transmission of the command CMD2 is started is longer than the time period T1 illustrated in FIG. 6.

In this case, in the memory system of the present embodiment, it is possible to adjust a setting value X2 indicating a timing when the signal level of the ready/busy signal R/Bn in the count circuit 159 is changed by a set feature command.

For example, a time period TD since the counting process is started until the count value reaches the setting value X2 is shorter than the time period TC since the counting process is started until the count value reaches the setting value X1.

The set feature command is a command for controlling the setting value inside the NAND flash memory 100 from the controller 200. For example, the set feature command is indicated by "EFh". For example, the setting value X2 is supplied from the controller 200 to the NAND flash memory 100 with the 4-bit signal DQ [3:0]. By using the set feature command, it is possible to adjust the setting values X1 and X2 of the timing when the signal level of the ready/busy signal R/Bn is changed in one cycle unit of the clock signal CLK.

Accordingly, the controller 200 can control the timing when the signal level of the ready/busy signal R/Bn in the NAND flash memory 100 transitions.

As a result, as illustrated in FIG. 10, at the time t3a, the signal level of the ready/busy signal R/Bn transitions from the "L" level to the "H" level at the timing when the count value reaches the setting value X2 adjusted by a set feature SF in the count circuit 159.

Therefore, according to the specification and design of the system, the memory system and the semiconductor memory of the second embodiment can flexibly control the timing of transmission and reception of the command, and the data transmission.

(3) Third Embodiment

The memory system and the semiconductor memory according to the third embodiment will be described with reference to FIG. 11.

Figure 11:
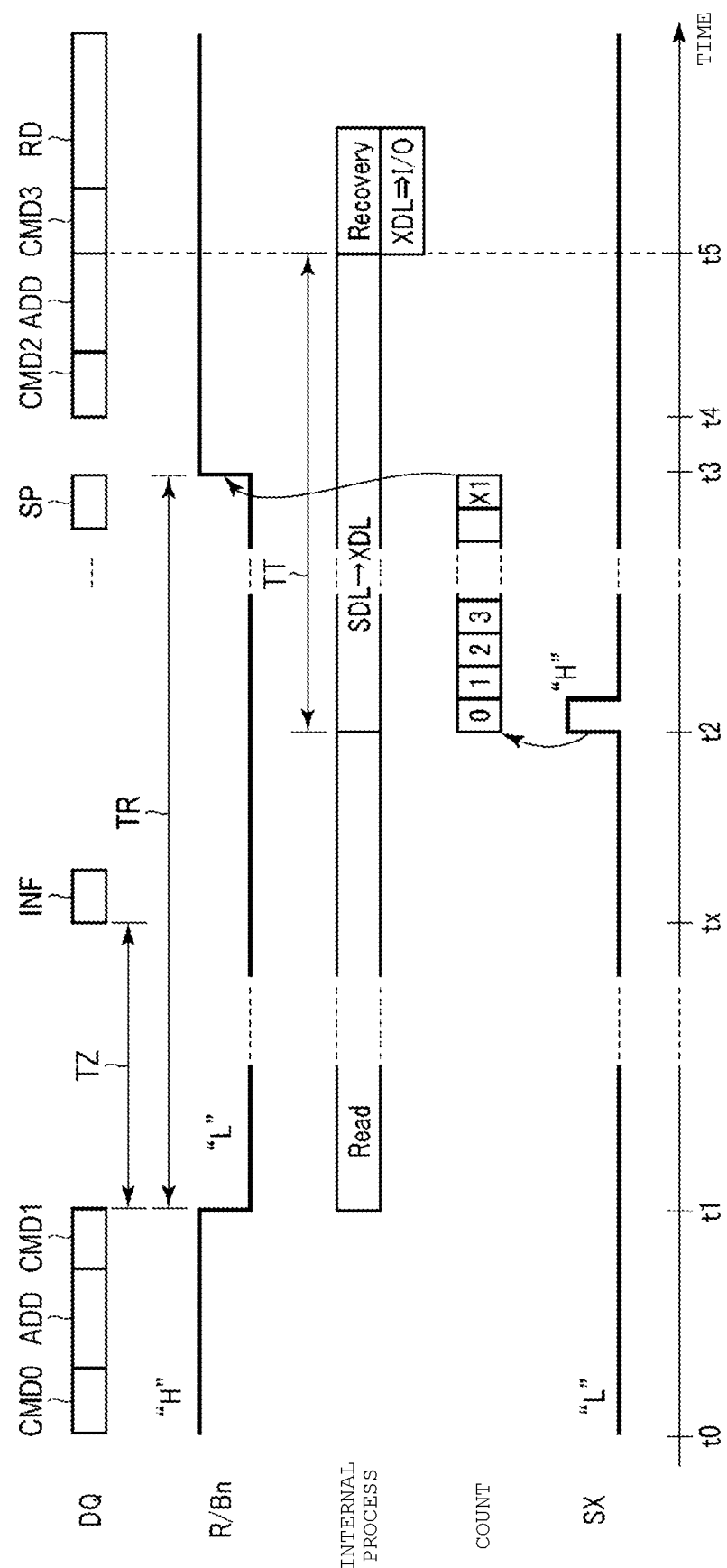
FIG. 11 is a timing chart illustrating an operation example of a memory system according to a third embodiment.

FIG. 11 is a timing chart illustrating an operation example of the memory system and the semiconductor memory according to the third embodiment.

As illustrated in FIG. 11, the NAND flash memory 100 may transmit information INF to the controller 200 at a timing (for example, time tx) at which a certain time period TZ elapses after the signal level of the ready/busy signal R/Bn is set to the "L" level.

The information INF includes information on the time period TR since the NAND flash memory 100 is set to the busy state until the NAND flash memory 100 is set to the ready state according to the received commands CMD0 and CMD1. As long as the information INF includes the information on the time period since the NAND flash memory 100 is set to the busy state until the NAND flash memory 100 is set to the ready state in which the command can be received from the controller 200, start and end points of the time period are not limited thereto.

The information INF may include information related to a time at which the data transmission between the latch circuits 202 and 210 is completed.

The controller 200 determines the timing of the transmission of the commands CMD2 and CMD3 for the register read based on the information INF of the NAND flash memory 100.

In this way, in the memory system of the present embodiment, the information INF on the time period (time period for reading of data) of the ready state of the NAND flash memory 100 is transmitted from the NAND flash memory 100 to the controller 200.

Accordingly, the memory system of the present embodiment can improve efficiency of the data transmission.

(4) Modification Example

A modification example of the memory system according to the embodiment will be described with reference to FIG. 12.

Figure 12:
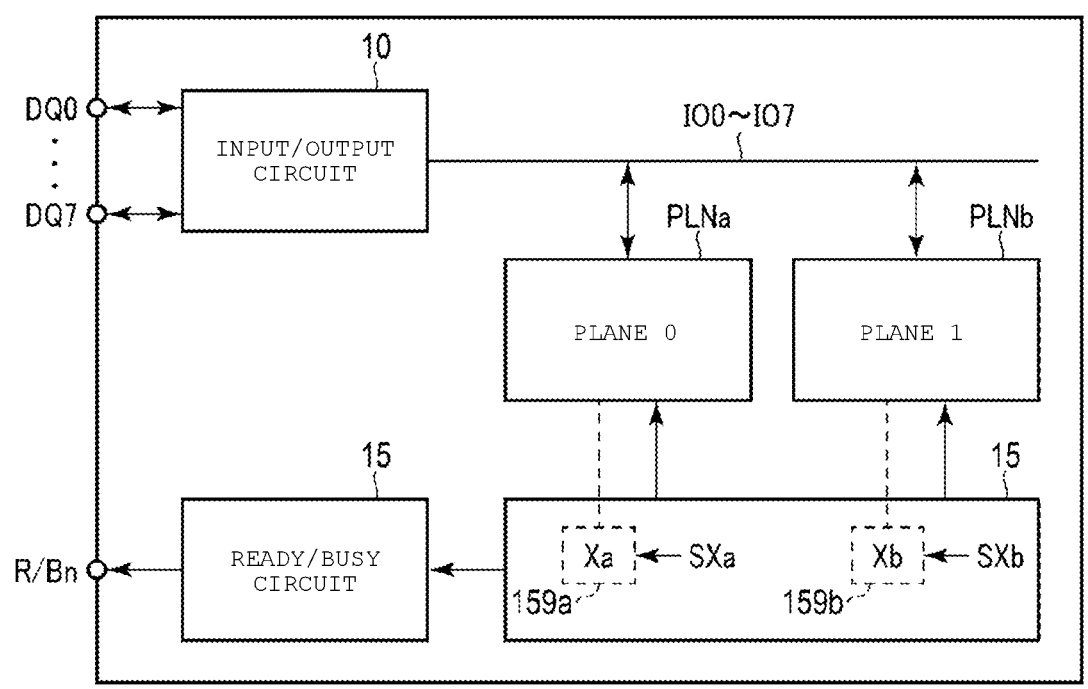
FIG. 12 is a schematic diagram illustrating a modification example of the memory system according to the embodiment.

FIG. 12 is a schematic diagram illustrating the modification example of the memory system according to the embodiment. FIG. 12 illustrates main units of the NAND flash memory 100 of the embodiment for short.

As illustrated in FIG. 12, the NAND flash memory 100 may include a plurality of planes PLNa and PLNb.

According to the planes PLNa and PLNb, the timing when the ready/busy signal R/Bn transitions by count circuits 159a and 159b may be different.

For example, the count circuit 159a is provided to correspond to the first plane PLNa. A condition signal SXa is supplied to the count circuit 159a.

A count circuit 159b is provided to correspond to the second plane PLNb. A condition signal SXb is supplied to the count circuit 159b. The condition signal SXb is independent of the condition signal SXa.

The count circuits 159a and 159b are respectively activated at the different timings by the condition signals SXa and SXb.

Accordingly, in response to the operation of the first plane PLNa, the signal level of the ready/busy signal R/Bn transitions from the "L" level to the "H" level at a timing which the count value of the count circuit 159a reaches a first value Xa.

On the other hand, in response to the operation of the second plane PLNb, the signal level of the ready/busy signal R/Bn transitions from the "L" level to the "H" level at a timing which the count value of the count circuit 159b reaches a second value Xb.

For example, the second setting value X2 may be different from the first value X1 according to variations in characteristics (e.g., response speed) of elements/circuits in a chip in some cases. In addition, the second setting value X2 may be set to the same value as the first value X1.

According to the modification example of the memory system of the present embodiment, even in a case where the NAND flash memory 100 includes the plurality of planes PLNa and PLNb, it is possible to speed up the data transmission and/or to improve the efficiency of the data transmission.

(5) Others

The semiconductor memory of the present embodiment may be a memory device other than the NAND flash memory. For example, the semiconductor memory of the present embodiment may be a resistance change memory such as a DRAM, an SRAM, a ReRAM, a phase change memory such as a PCRAM, or a magnetic memory such as an MRAM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array including a plurality of memory cells, each memory cell being capable of storing data;
a sense circuit configured to sense the data stored in a memory cell of the plurality of memory cells;
a first data latch configured to latch data sensed from the memory cell by the sense circuit;
a second data latch configured to receive the data from the first data latch;
a status register configured to store information indicating whether the semiconductor memory device is in a ready state or in a busy state;
an input/output circuit configured to output from the semiconductor memory device the data received from the second data latch and the information received from the status register; and
a control circuit configured to control the status register to store the information indicating the busy state upon receipt of a read command and to control the status register to store the information indicating the ready state, before completion of transfer of the data sensed from the memory cell from the first data latch to the second data latch.

2. The semiconductor memory device according to claim 1, further comprising:
an input/output pin electrically connected with the input/output circuit, wherein
the input/output circuit receives a command through the input/output pin when the information stored in the status register indicates the ready state.

3. The semiconductor memory device according to claim 2, wherein
upon receipt of the read command, the sense circuit senses the data stored in the memory cell, the first latch circuit latches the data, and the second latch circuit receives the data, and
upon receipt of a status inquiry command, the input/output circuit outputs, from the semiconductor memory device, the information received from the status register.

4. The semiconductor memory device according to claim 3, wherein upon receipt of a data out command, the input/output circuit outputs, from the semiconductor memory device, the data received from the second data latch.

5. The semiconductor memory device according to claim 4, wherein the read command is received while the information stored in the status register indicates the ready state, the status inquiry command is received while the information stored in the status register indicates the busy state and the data out command is received while the information stored in the status register indicates the ready state.

6. The semiconductor memory device according to claim 1, wherein the control circuit is configured to control the status register to output the information indicating the ready state upon elapse of a first period during which the data from the first data latch is received by the second data latch.

7. The semiconductor memory device according to claim 6, wherein a sum of the first period and a second period is shorter than a third period, where the second period corresponds to a period from start to completion of receipt of a data out command, and where the third period corresponds to a period from start to completion of transfer of the data from the first data latch to the second data latch.

8. The semiconductor memory device according to claim 6, wherein the control circuit is configured to change the first period upon receipt of a set feature command.

9. The semiconductor memory device according to claim 6, wherein the control circuit is configured to set the first period as a threshold number of clock cycles, and control the status register to store the information indicating the ready state when the number of clock cycles after the start of transfer of the data latched in the first data latch to the second data latch reaches the threshold number.

10. The semiconductor memory device according to claim 1, wherein the control circuit starts a counting process when a transfer of the data latched in the first data latch to the second data latch begins, and controls the status register to output the ready signal when a count value according to the counting process reaches a preset value.

11. A method of controlling, by a control circuit, a read operation in a semiconductor memory device including a memory cell array that includes a plurality of memory cells each being capable of storing data, a sense circuit configured to sense the data stored in a memory cell of the plurality of the memory cells, a first data latch configured to latch data sensed from the memory cell by the sense circuit, a second data latch configured to receive the data from the first data latch, a status register configured to store information indicating whether the semiconductor memory device is in a ready state or in a busy state, and an input/output circuit configured to output from the semiconductor memory device the data received from the second data latch and the information received from the status register, said method comprising:

receiving a read command; and responsive to receiving the read command, controlling the status register to store the information indicating the busy state, and before completion of transfer of the data sensed from the memory cell from the first data latch to the second data latch, controlling the status register to store the information indicating the ready state.

12. The method according to claim 11, wherein the semiconductor memory device further includes an input/output pin electrically connected with the input/output circuit, said method further comprising:

receiving an indication that the input/output circuit received a command through the input/output pin when the information stored in the status register indicates the ready state.

13. The method according to claim 12, further comprising:

receiving a status inquiry command; and responsive to receiving the status inquiry command, causing the input/output circuit to output the information received from the status register.

14. The method according to claim 13, further comprising:

receiving a data out command; and responsive to receiving the data out command, outputting, by the input/output circuit, the data received from the second data latch.

15. The method according to claim 14, wherein the read command is received while the information stored in the status register indicates the ready state, the status inquiry command is received while the information stored in the status register indicates the busy state, and the data out command is received while the information stored in the status register indicates the ready state.

16. The method according to claim 11, further comprising:

causing the status register to output the information indicating the ready state upon elapse of a first period from start of transfer of the data from the first data latch to the second data latch.

17. The method according to claim 16, wherein a sum of the first period and a second period is shorter than a third period, where the second period corresponds to a period from start to completion of receipt of a data out command, and where the third period corresponds to a period from start to completion of transfer of the data from the first data latch to the second data latch.

18. The method according to claim 16, further comprising:

receiving a set feature command; and changing the first period in response to receiving the set feature command.

19. The method according to claim 16, wherein the first period is set as a threshold number of clock cycles, said method further comprising:

causing the status register to store the information indicating the ready state when the number of clock cycles after start of transfer of the data latched in the first data latch to the second data latch reaches the threshold number.

20. The method according to claim 11, further comprising:

starting a counting process when a transfer of the data latched in the first data latch to the second data latch begins; and controlling the status register to output the ready signal when a count value according to the counting process reaches a preset value.

* * * * *